United States Patent
Orimoto et al.

(10) Patent No.: US 7,354,826 B1
(45) Date of Patent: Apr. 8, 2008

(54) METHOD FOR FORMING MEMORY ARRAY BITLINES COMPRISING EPITAXIALLY GROWN SILICON AND RELATED STRUCTURE

(75) Inventors: Takashi Orimoto, Mountain View, CA (US); Robert B. Ogle, San Jose, CA (US); Rinji Sugino, San Jose, CA (US)

(73) Assignees: Spansion LLC, Sunnyvale, CA (US); Advanced Micro Devices, Inc., Sunnyvale, CA (US)

( * ) Notice: Subject to any disclaimer, the term of this patent is extended or adjusted under 35 U.S.C. 154(b) by 371 days.

(21) Appl. No.: 11/112,607

(22) Filed: Apr. 22, 2005

(51) Int. Cl.
*H01L 21/20* (2006.01)
*H01L 21/36* (2006.01)

(52) U.S. Cl. .................. 438/269; 438/222; 438/429

(58) Field of Classification Search ............ 438/222, 438/226, 269, 360, 363, 429, 442
See application file for complete search history.

(56) References Cited

U.S. PATENT DOCUMENTS 6,495,294 B1 * 12/2002 Yamauchi et al. .......... 438/597
6,723,618 B2 * 4/2004 Meyer et al. ............... 438/429
2002/0173110 A1 * 11/2002 Schrems et al. ............ 438/386

* cited by examiner

*Primary Examiner*—Zandra V. Smith
*Assistant Examiner*—Pamela E Perkins
(74) *Attorney, Agent, or Firm*—Farjami & Farjami LLP

(57) ABSTRACT

According to one exemplary embodiment, a method of fabricating a bitline in a memory array includes forming a trench in a substrate, where the trench has sidewalls and a bottom surface. The method further includes performing a selective epitaxial process to partially fill the trench with selective epitaxially grown silicon, where the selective epitaxially grown silicon is situated on the sidewalls and bottom surface of the trench. The selective epitaxially grown silicon is doped in the selective epitaxial process. The method further includes performing a silicon reflow process to cause the selective epitaxially silicon to be redistributed in the trench. The method further includes performing a number of selective epitaxial process/silicon reflow process cycles to substantially fill the trench with the selective epitaxially grown silicon. The method further includes extending a top surface of the selective epitaxially grown silicon in the trench above an ONO stack to form the bitline.

9 Claims, 6 Drawing Sheets

METHOD FOR FORMING MEMORY ARRAY BITLINES COMPRISING EPITAXIALLY GROWN SILICON AND RELATED STRUCTURE

TECHNICAL FIELD

The present invention is generally in the field of semiconductor devices. More particularly, the invention is in the field of fabrication of memory arrays.

BACKGROUND ART

A typical memory array, such as a flash memory, includes columns of bitlines, which are formed in a substrate, and rows of wordlines, which are situate over and aligned perpendicular to the bitlines. In a flash memory array, memory cells are situated over a channel region, which is formed in the substrate between adjacent bitlines. The memory cells can be, for example, floating gate memory cells, which store charge in a floating gate, or Advanced Micro Devices' (AMD) MirrorBit™ memory cells, which store charge in a nitride layer of an ONO (Oxide-Nitride-Oxide) stack.

In a conventional bitline formation process, bitlines are formed by implanting a dopant into the substrate and activating the dopant in an anneal process, such as a rapid thermal anneal (RTA) process. In addition to activating the dopant, the anneal process is used to repair damage to the crystal structure of the wafer caused by the implant process. However, the anneal process also causes thermal diffusion, whereby dopant diffuses laterally into the channel region. During the anneal process, vertical and lateral dopant diffusion can increase as a result of transient enhanced diffusion (TED). By way of background, TED is an undesirable transient effect wherein the diffusion coefficient of the implanted dopant increases temporarily during post-implantation annealing as a result of crystal structure damage caused by the implant process. Thus, as discussed above, the dopant implantation process and the anneal process used in the conventional bitline formation process cause lateral diffusion of dopant into channel region of the flash memory array.

By causing lateral diffusion of dopant into the channel region, the conventional bitline formation process also undesirably reduce the effective length of the channel region. Since charge is stored above the channel region in a memory cell, reducing the effective length of the channel region also undesirably reduces the effective charge-storing area above the channel region. Reduction of the effective length of the channel region is especially problematic for MirrorBit™ memory cells, since two localized charge regions in each MirrorBit™ memory cell can undesirably affect each other as a result of being closer together. Also, by decreasing the effective channel length, lateral straggle and TED can increase undesirable short channel effects, such as punch through and drain induced barrier lowering (DIBL).

Thus, there is a need in the art for an effective method of forming bitlines in a memory array, such as a flash memory array, that prevents lateral straggle and transient enhanced diffusion caused by a conventional bitline implantation process.

SUMMARY

The present invention is directed to method for forming memory array bitlines comprising selective epitaxially grown silicon and related structure. The present invention addresses and resolves the need in the art for an effective method of forming bitlines in a memory array, such as a flash memory array, that prevents lateral straggle and transient enhanced diffusion caused by a conventional bitline implantation process.

According to one exemplary embodiment, a method of fabricating a bitline in a memory array includes forming a trench in a substrate, where the trench has sidewalls and a bottom surface. An ONO stack is situated on the substrate such that the trench is formed in the ONO stack and extends into the substrate. The trench may have an aspect ratio greater than 1.0, for example. The method further includes performing a selective epitaxial process to partially fill the trench with selective epitaxially grown silicon, where the selective epitaxially grown silicon is situated on the sidewalls and bottom surface of the trench. The selective epitaxially grown silicon is doped in the selective epitaxial process.

According to this embodiment, the method further includes performing a silicon reflow process, where the silicon reflow process causes the selective epitaxially silicon to be redistributed in the trench. The silicon reflow process may be a hydrogen ambient bake process, for example. The method further includes performing a number of selective epitaxial process/silicon reflow process cycles to substantially fill the trench with the selective epitaxially grown silicon. For example, between two and eight selective epitaxial process/silicon reflow process cycles may be performed to substantially fill the trench. The method further includes extending a top surface of the selective epitaxially grown silicon in the trench above the ONO stack to form the bitline.

According to one embodiment, the invention is a structure that is achieved by utilizing the above-described method. Other features and advantages of the present invention will become more readily apparent to those of ordinary skill in the art after reviewing the following detailed description and accompanying drawings.

DETAILED DESCRIPTION OF THE INVENTION

Figure 1:
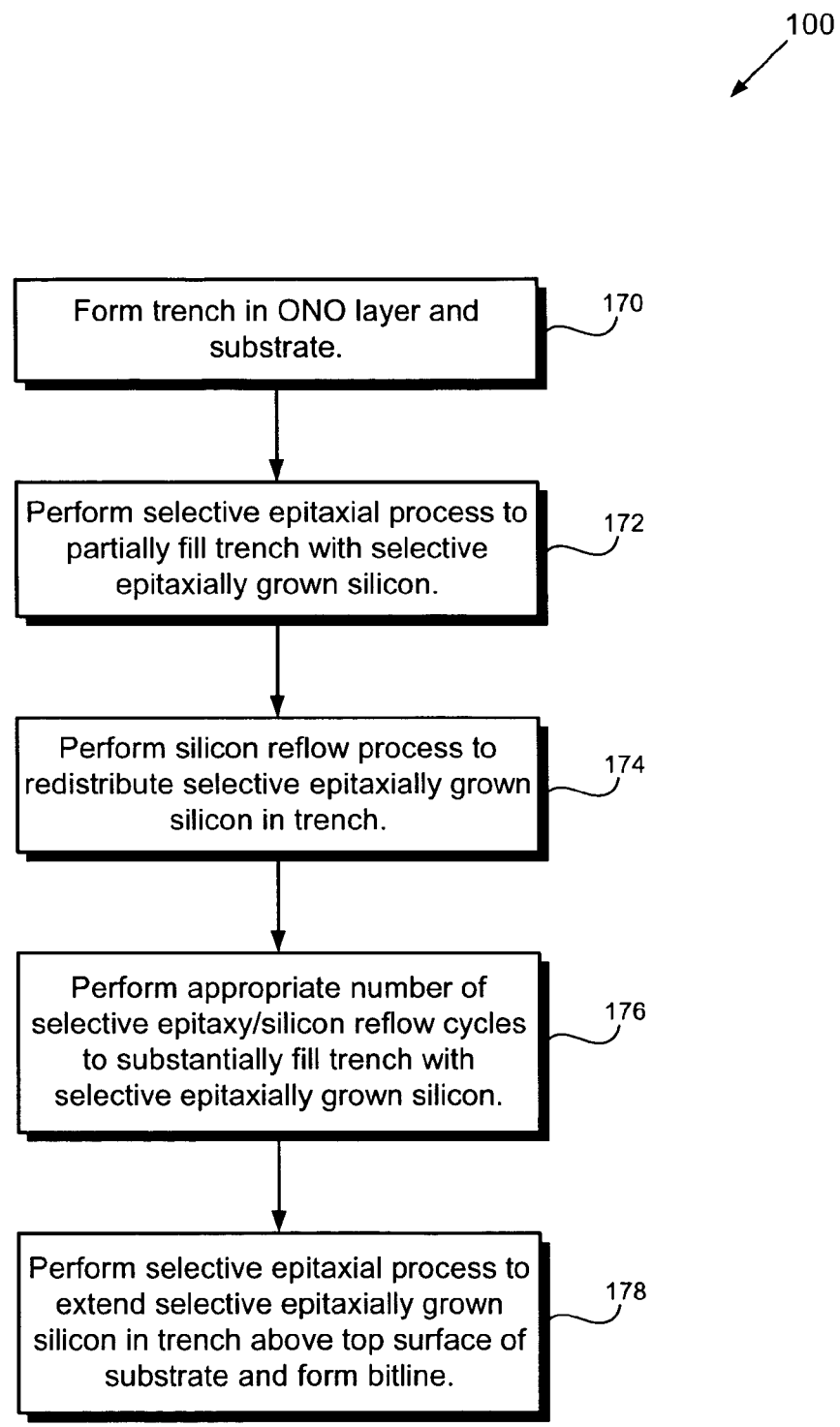
FIG. 1 shows a flowchart illustrating the steps taken to implement an embodiment of the present invention.

The present invention is directed to method for forming memory array bitlines comprising selective epitaxially grown silicon and related structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It should be borne in mind that, unless noted otherwise, like or corresponding elements among the figures may be indicated by like or corresponding reference numerals.

The present invention involves a process that can be used to effectively form bitlines in a memory array, such as a flash memory array employing MirrorBit™ or floating gate memory cells, while avoiding undesirable effects of lateral diffusion and TED (transient enhanced diffusion), which can occur as a result of a conventional bitline implantation process. Although a bitline formation process is utilized to illustrate the present invention, the present invention can also be applied in other applications to form doped regions without using a dopant implantation process and associated anneal process. For example, the present invention can be applied to form source/drain regions in transistor logic devices.

FIG. 1 shows a flowchart illustrating an exemplary method according to an embodiment of the present invention. Certain details and features have been left out of flowchart 100 that are apparent to a person of ordinary skill in the art. For example, a step may consist of one or more substeps or may involve specialized equipment, as known in the art. While steps 170 through 178 indicated in flowchart 100 are sufficient to describe one embodiment of the present invention, other embodiments of the invention may use steps different from those shown in flowchart 100. It is noted that the processing steps shown in flowchart 100 are performed on a wafer, which, prior to step 170, includes an Oxide-Nitride-Oxide (ONO) stack situated on a substrate.

Moreover, structures 270 through 278 in FIGS. 2A through 2E illustrate the result of performing steps 170 through 178 of flowchart 100, respectively. For example, structure 270 shows a semiconductor structure after processing step 170, structure 272 shows structure 270 after the processing of step 172, structure 274 shows structure 272 after processing step 174, and so forth. It is noted that although formation of only one bitline is specifically discussed herein to preserve brevity, multiple bitlines may be formed in a substrate in a memory array, such as a flash memory array, by utilizing the innovative process of the present invention.

Figure 2A:
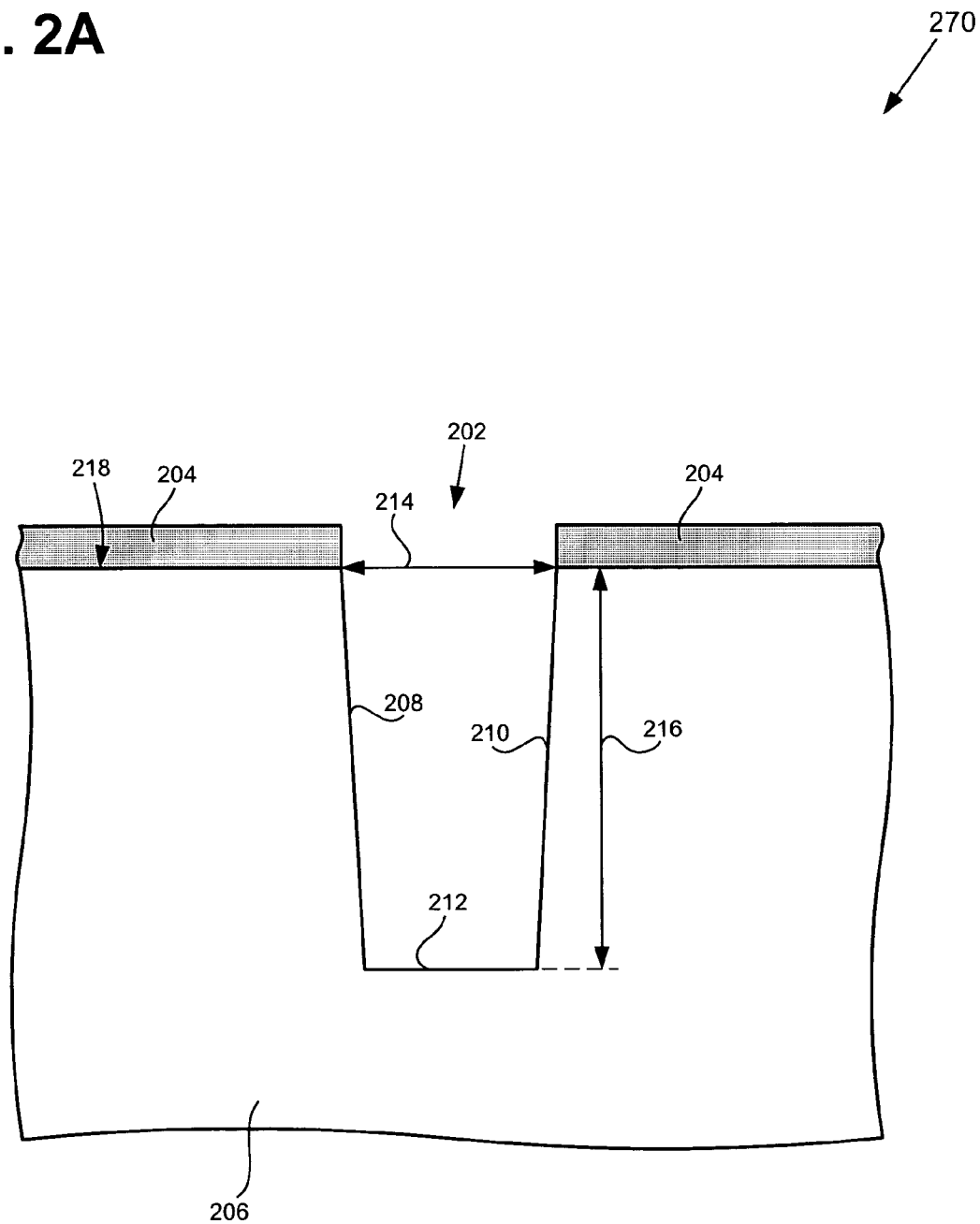
FIG. 2A illustrates a cross-sectional view, which includes a portion of a wafer processed according to an embodiment of the present invention, corresponding to an initial step in the flowchart of FIG. 1.

Referring now to step 170 in FIG. 1 and structure 270 in FIG. 2A, at step 170 of flowchart 100, trench 202 is formed in ONO stack 204 and substrate 206. Structure 270 can be a portion of a memory array, such as a flash memory array. ONO stack 204 is a three-layer structure that comprises a bottom layer of silicon oxide, a middle layer of silicon nitride, and a top layer of silicon oxide and can be formed in a manner known in the art. In other embodiments, a dielectric layer other than an ONO stack may be situated on substrate 206. Trench 202 can be formed in a two-step etch process, where an initial trench is patterned and etched in ONO stack 204 in a first etch step and the initial trench is extended into substrate 206 in a second etch step. By utilizing a two-step etch process, increased etch selectivity can be achieved in each etch step. In one embodiment, trench 202 may be formed in ONO stack 204 and substrate 206 in a single etch step.

As shown in FIG. 2A, trench 202 has sidewalls 208 and 210, bottom surface 212, width 214, and depth 216. By way of example, width 214, which corresponds to the distance between sidewalls 208 and 210 of trench 202 at top surface 218 of substrate 206, can be between 60.0 nanometers (nm) and 200.0 nm. By way of example, depth 216, which is the distance between bottom surface 212 of trench 202 and top surface 218 of substrate 206, can be between 100.0 nm and 400 nm. In one embodiment, width 214 may be approximately 140.0 nm and depth 216 may be approximately 340.0 nm. In the present embodiment, the aspect ratio of trench 202, which is equal to depth 216 of trench 202 divided by width 214 of trench 202, is approximately equal to or greater than 1.0. In other embodiments, the aspect ratio of trench 202 may be less than 1.0. The result of step 170 of flowchart 100 is illustrated by structure 270 in FIG. 2A.

Figure 2B:
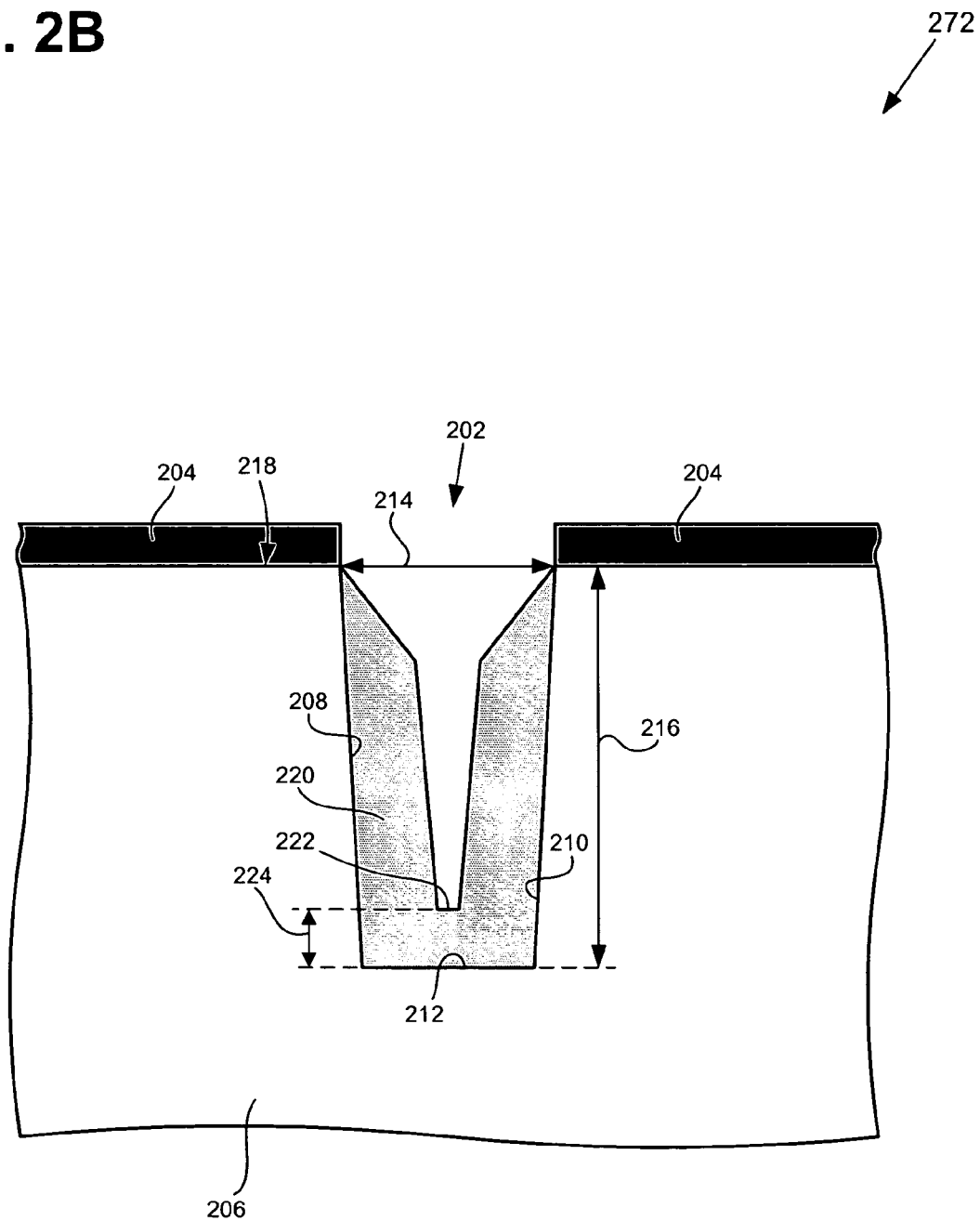
FIG. 2B illustrates a cross-sectional view, which includes a portion of a wafer processed according to an embodiment of the present invention, corresponding to an intermediate step in the flowchart of FIG. 1.

Referring to step 172 in FIG. 1 and structure 272 in FIG. 2B, at step 172 of flowchart 100, a selective epitaxial process is performed to partially fill trench 202 with selective epitaxially grown (SEG) silicon. As shown in FIG. 2B, SEG silicon portion 220 is situated on sidewalls 208 and 210 and bottom surface 212 of trench 202. SEG silicon portion 220 is formed in a selective epitaxial process, which can utilize dichlorosilane (DCS), hexachlorodisilane, or other appropriate silicon precursor, to grow single-crystal silicon on sidewalls 208 and 210 and bottom surface 212 of trench 202. In the selective epitaxial process, hydrogen chloride (HCl) is used for increasing selectivity and, thereby, preventing silicon from growing on dielectric surfaces or on ONO stack 204. HCl is also used to assist SEG silicon to grow in trench 202 in a direction perpendicular to top surface 218 of substrate 206 instead of in multiple directions. However, the amount of HCl must be carefully controlled in the selective epitaxial process, since an excessive amount of HCl can significantly reduce the growth rate of the SEG silicon. The selective epitaxial process can be implemented by using a chemical vapor deposition (CVD) process or other appropriate processes to grow silicon on exposed silicon surfaces, such as sidewalls 208 and 210 and bottom surface 212 of trench 202.

The selective epitaxial process can be performed in a temperature range of between approximately 750.0° C. and approximately 875.0° C. for between 5.0 minutes and 20.0 minutes to partially fill trench 202 with SEG silicon portion 220. In one embodiment, the selective epitaxial process can be performed for approximately 10.0 minutes to partially fill trench 202. In the present embodiment, the selective epitaxial process can achieve an average growth rate of 10.0 nm of SEG silicon per minute. In the present embodiment, SEG silicon portion 220 can be doped with arsenic during the selective epitaxial process. By way of example, approximately 1.0 percent arsine in hydrogen can be used as a dopant source to dope SEG silicon 220 with arsenic during the selective epitaxial process. In other embodiments, SEG silicon 220 may be doped with boron, phosphorus, germanium, or other appropriate dopant. In one embodiment, SEG silicon portion 220 may not be doped during the selective epitaxial process. As a result of the selective epitaxial process, bottom surface 222 of SEG silicon portion 220 is situated distance 224 above bottom surface 212 of trench 202. The result of step 172 of flowchart 100 is illustrated by structure 272 in FIG. 2B.

Figure 2C:
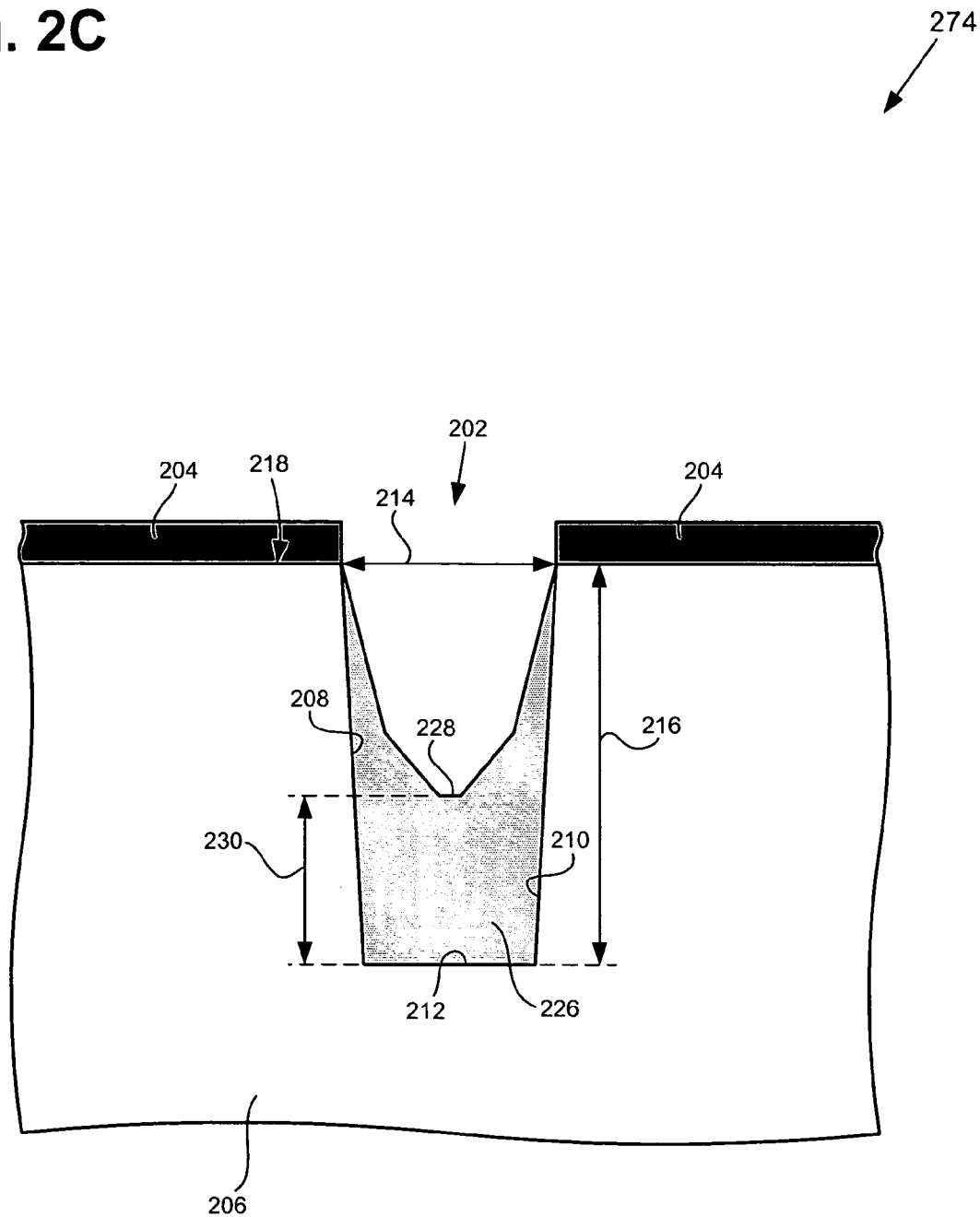
FIG. 2C illustrates a cross-sectional view, which includes a portion of a wafer processed according to an embodiment of the present invention, corresponding to an intermediate step in the flowchart of FIG. 1.

Referring to step 174 in FIG. 1 and structure 274 in FIG. 2C, at step 174 of flowchart 100, a silicon reflow process is performed to redistribute SEG silicon portion 222 (FIG. 2B) in trench 202. As a result of the silicon reflow process, SEG silicon portion 222 (FIG. 2B) is redistributed in trench 202 to form SEG silicon portion 226. As shown in FIG. 2C, SEG silicon portion 226 is situated on sidewalls 208 and 210 and bottom surface 212 of trench 202 and has bottom surface 228, which is situated distance 230 above bottom surface 212. In the present embodiment, the silicon reflow process can comprise a hydrogen ambient bake process, which can be performed at a temperature of between approximately 800.0° C. and approximately 900.0° C. for between 15.0 second duration and 120.0 second duration. During the hydrogen ambient bake process, hydrogen is utilized to increase the surface mobility of the silicon atoms, which causes part of SEG silicon portion 222 (FIG. 2B) situated on sidewalls 208 and 210 of trench 202 to be redistributed at the bottom of trench 202. Thus, as a result of the hydrogen ambient bake process, SEG silicon portion 222 (FIG. 2B) is redistributed in trench 202 to form SEG silicon portion 226.

During the hydrogen ambient bake process, facets (i.e. crystallographic planes) formed in SEG silicon portion 220 (FIG. 2B) during the selective epitaxial process are flatten and smoothed out, and any overgrowth of SEG silicon on the surface of ONO stack 204 is pushed back into trench 202. Thus, as a result of the hydrogen ambient bake process, distance 230 of bottom surface 228 of SEG silicon portion 226 is greater than distance 224 (FIG. 2B) of bottom surface 222 of SEG silicon portion 220. After the hydrogen ambient bake process has been performed, SEG silicon portion 226 remains an epitaxial film. In other embodiments, the silicon reflow process may comprise heating processes other than the hydrogen ambient bake process discussed above to redistribute SEG silicon portion 220 (FIG. 2B). The result of step 174 of flowchart 100 is illustrated by structure 274 in FIG. 2C.

Figure 2D:
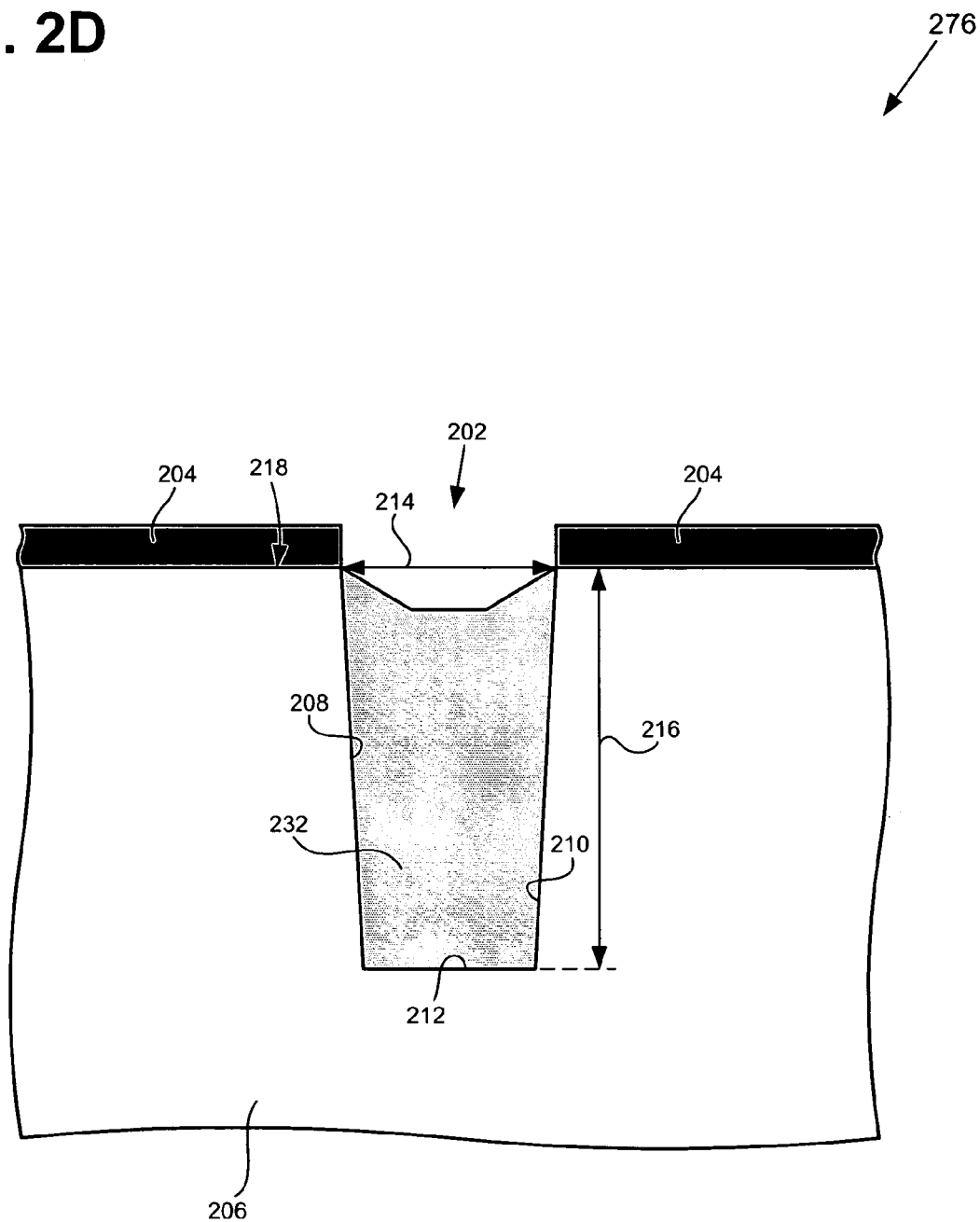
FIG. 2D illustrates a cross-sectional view, which includes a portion of a wafer processed according to an embodiment of the present invention, corresponding to an intermediate step in the flowchart of FIG. 1.

Referring to step 176 in FIG. 1 and structure 276 in FIG. 2D, at step 176 of flowchart 100, an appropriate number of selective epitaxial process/silicon reflow process cycles are performed to substantially fill trench 202 with SEG silicon. As shown in FIG. 2D, SEG silicon portion 232 is situated on sidewalls 208 and 210 and bottom surface 212 and substantially fills trench 202. SEG portion 232 can be formed by performing three selective epitaxial process/silicon reflow process cycles, where each selective epitaxial process step is substantially similar to the selective epitaxial process discussed above at step 172 of flowchart 100 and each silicon reflow process step is substantially similar to the silicon reflow process discussed above at step 174 of flowchart 100. In other embodiments, between two and eight selective epitaxial process/silicon reflow process cycles may be performed to substantially fill trench 202 with SEG silicon.

The number of selective epitaxial process/silicon reflow process cycles required to substantially fill trench 202 with SEG silicon depends on the aspect ratio of trench 202. For example, as the aspect ratio of trench 202 increases, the number of selective epitaxial process/silicon reflow process cycles required to substantially fill trench 202 increases correspondingly. In the present embodiment, each selective epitaxial process step performed to form SEG silicon portion 232 can be doped in a similar manner and can comprise a similar dopant (i.e. arsenic) as the selective epitaxial process discussed above at step 172 of flowchart 100. In other embodiments, each selective epitaxial process step performed during formation of SEG silicon portion 232 may be doped with boron, phosphorus, germanium, or other appropriate dopant. In one embodiment, each selective epitaxial process step performed during formation of SEG silicon portion 232 may not be doped.

Also, since a silicon reflow process step is performed after each selective epitaxial process step during formation of SEG silicon portion 232, SEG silicon portion 232 is formed as an epitaxial film that does not comprise seams or other defects that might otherwise form between successive selective epitaxial process steps. In other words, SEG silicon portion 232 comprises a seamless crystalline structure. Furthermore, by employing a silicon reflow process, such as a hydrogen ambient bake process, to flatten and smooth out facets that occur in SEG silicon during the selective epitaxial process, the present invention advantageously achieves a substantial increase in the rate at which trench 202 is filled with SEG silicon. The result of step 176 of flowchart 100 is illustrated by structure 276 in FIG. 2D.

Figure 2E:
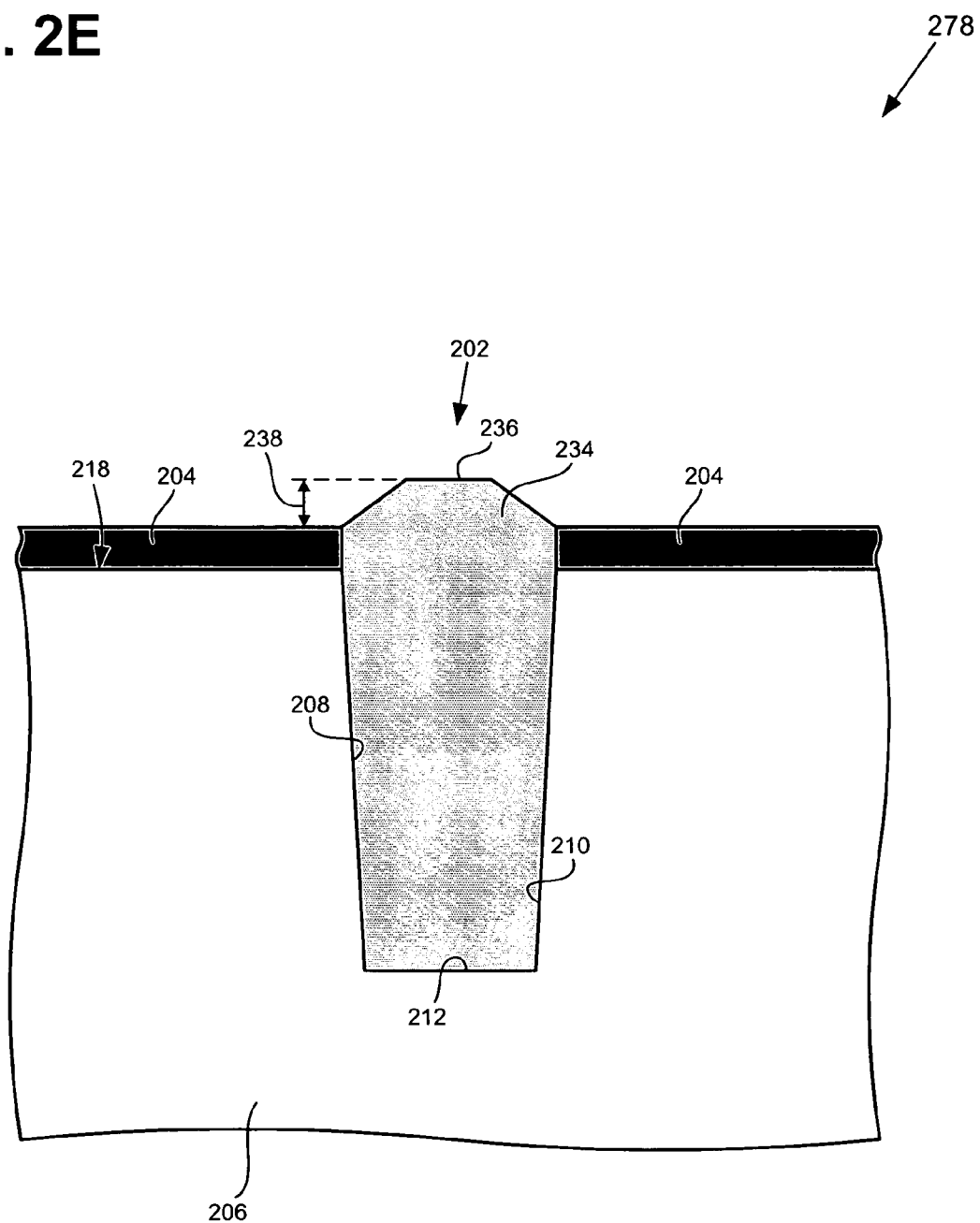
FIG. 2E illustrates a cross-sectional view, which includes a portion of a wafer processed according to an embodiment of the present invention, corresponding to a final step in the flowchart of FIG. 1.

Referring to step 178 in FIG. 1 and structure 278 in FIG. 2E, at step 178 of flowchart 100, a selective epitaxial process is performed to extend SEG silicon in trench 202 above ONO stack 204 and form bitline 234. As shown in FIG. 2E, top surface 236 of bitline 234 extends a distance (i.e. distance 238) above ONO stack 204. By way of example, distance 238 can be between 30.0 nm and 100.0 nm. In one embodiment, distance 238 may be approximately 45.0 nm. Bitline 234 comprises SEG silicon and can be formed by performing a selective epitaxial process to extend SEG silicon portion 232 (FIG. 2D) a distance (i.e. distance 238) above ONO stack 204. The selective epitaxial process performed to extend SEG silicon portion 232 (FIG. 2D) above ONO stack 204 and, thereby, form bitline 234 is similar to the selective epitaxial process discussed above at steps 172 and 176 of flowchart 100. In the present embodiment, bitline 234 comprises SEG doped silicon, which is doped with arsenic. In other embodiments, bitline 234 may comprise SEG silicon, which is doped with boron, phosphorus, or other appropriate dopant. In one embodiment, bitline 234 may not extend above the surface of ONO stack 204. The result of step 178 of flowchart 100 is illustrated by structure 278 in FIG. 2E.

Thus, as a result of the present invention's innovative method discussed above, the present invention advantageously achieves a bitline comprising SEG doped silicon and having a seamless crystalline structure. Also, since a dopant such as arsenic is introduced into the epitaxial process during formation of the bitline (e.g. bitline 234), the arsenic atoms grow epitaxially with the SEG silicon and, consequently, do not require an anneal process for activation. In contrast, in a conventional bitline implantation process, an anneal process, which can cause undesirable later diffusion, is required to activate the implanted dopant. Thus, by forming a bitline comprising SEG doped silicon, the present invention advantageously prevents undesirable lateral diffusion.

Furthermore, by not requiring a dopant implant for bitline formation, the present invention advantageously avoids implant damage to the silicon structure and TED (transient enhanced diffusion) that is caused by implant damage. Additionally, by preventing lateral diffusion and TED, the present invention advantageously decreases undesirable short channel effects such as punch through and DIBL. Moreover, since the present invention does not require a dopant implant and an anneal process to activate the dopant and repair implant damage, the present invention advantageously achieves a reduction in number of process steps and associated cost.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a method for forming memory array bitlines comprising selective epitaxially grown silicon and related structure have been described.

The invention claimed is:

1. A method for fabricating a bitline in a memory array, said method comprising steps of:
   forming a trench in a substrate, said trench having sidewalls and a bottom surface;
   performing a selective epitaxial process to partially fill said trench with selective epitaxially grown silicon, said selective epitaxially grown silicon being situated on said sidewalls and said bottom surface of said trench;
   performing a silicon reflow process, wherein said silicon reflow process causes said selective epitaxially grown silicon to be redistributed in said trench, wherein said silicon reflow process comprises a hydrogen ambient bake process, and wherein said selective epitaxially grown silicon is doped in said selective epitaxial process.

2. The method of claim 1 further comprising a step of performing a plurality of selective epitaxial process/silicon reflow process cycles to substantially fill said trench with said selective epitaxially grown silicon.

3. The method of claim 2 further comprising a step of extending a top surface of said selective epitaxially grown silicon in said trench above an ONO stack situated on said substrate to form said bitline.

4. The method of claim 1 wherein said step of forming said trench in said substrate comprises forming said trench in an ONO stack situated on said substrate and extending said trench into said substrate.

5. The method of claim 2 wherein said step of performing said plurality of selective epitaxial process/silicon reflow process cycles comprises performing between two and eight selective epitaxial process/silicon reflow process cycles.

6. A method for fabricating a bitline in a memory array, said method comprising steps of:
   forming a trench in a substrate, said trench having sidewalls and a bottom surface;
   performing a selective epitaxial process to partially fill said trench with selective epitaxially grown silicon, said selective epitaxially grown silicon being situated on said sidewalls and said bottom surface of said trench;
   performing a silicon reflow process, wherein said silicon reflow process causes said selective epitaxially grown silicon to be redistributed in said trench, wherein said silicon reflow process comprises a hydrogen ambient bake process, and wherein said selective epitaxially grown silicon is doped in said selective epitaxial process.

7. The method of claim 6 further comprising a step of performing a plurality of selective epitaxial process/silicon reflow process cycles to substantially fill said trench with said selective epitaxially grown silicon.

8. The method of claim 7 further comprising a step of extending a top surface of said epitaxially grown silicon in said trench above an ONO stack situated on said substrate to form said bitline.

9. The method of claim 6 wherein said step of forming said trench in said substrate comprises forming said trench in an ONO stack situated on said substrate and extending said trench into said substrate.

* * * * *